United States Patent
Bueb et al.

(10) Patent No.: US 11,742,042 B2
(45) Date of Patent: Aug. 29, 2023

(54) PROGRAM PULSE CONTROL USING ENVIRONMENTAL PARAMETERS

(71) Applicant: Micron Technology, Inc., Boise, ID (US)

(72) Inventors: Christopher J. Bueb, Folsom, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/474,539

(22) Filed: Sep. 14, 2021

(65) Prior Publication Data

US 2021/0407555 A1 Dec. 30, 2021

Related U.S. Application Data

(63) Continuation of application No. 16/669,244, filed on Oct. 30, 2019, now Pat. No. 11,145,336.

(51) Int. Cl.
| | | |
|---|---|---|
| G11C 29/02 | (2006.01) | |
| G06F 11/07 | (2006.01) | |
| G06F 11/30 | (2006.01) | |
| G11C 11/4074 | (2006.01) | |
| G11C 11/56 | (2006.01) | |
| G11C 11/406 | (2006.01) | |
| G11C 7/04 | (2006.01) | |

(52) U.S. Cl.
CPC .......... *G11C 29/028* (2013.01); *G06F 11/076* (2013.01); *G06F 11/0793* (2013.01); *G06F 11/3037* (2013.01); *G06F 11/3058* (2013.01); *G11C 7/04* (2013.01); *G11C 11/4074* (2013.01); *G11C 11/40626* (2013.01); *G11C 11/5628* (2013.01)

(58) Field of Classification Search
CPC . G11C 7/04; G11C 11/40626; G11C 11/4074; G11C 11/5628; G11C 2029/0409; G11C 16/10; G11C 29/021; G11C 29/028; G11C 16/349; G11C 16/3404; G06F 11/076; G06F 11/0793; G06F 11/3037; G06F 11/3058; G06F 11/3409; G06F 11/3466

See application file for complete search history.

(56) References Cited

U.S. PATENT DOCUMENTS 9,747,028 B1 * 8/2017 Allen .................. G06F 9/45558
2008/0068873 A1 3/2008 Matsuno et al.
(Continued)

OTHER PUBLICATIONS

Shi Weihua et al. "Temperature self-adaptive program algorithm on 65 nm MLC NOR flash memory". Journal of Semiconductors, Aug. 2009, 5 pages.

*Primary Examiner* — Steve N Nguyen
(74) *Attorney, Agent, or Firm* — Lowenstein Sandler LLP (57) ABSTRACT

A method comprising receiving, at a memory sub-system from a host system, receiving, at one or more configuration parameters reflecting an expected type of use of the memory sub-system; receiving one or more environmental parameters of the memory sub-system, wherein the environmental parameters reflect characteristics of an environment of the memory sub-system; and selecting a programming operation parameter to be utilized by the memory sub-system based on the configuration parameters and environmental parameters.

18 Claims, 6 Drawing Sheets

(56) References Cited

U.S. PATENT DOCUMENTS

| | | | |
|---|---|---|---|
| 2009/0091979 A1* | 4/2009 | Shalvi | G11C 16/28 |
| | | | 365/45 |
| 2010/0153680 A1* | 6/2010 | Baum | G11B 5/5565 |
| | | | 711/E12.002 |
| 2010/0322005 A1* | 12/2010 | Dong | G11C 16/10 |
| | | | 365/185.17 |
| 2011/0015881 A1* | 1/2011 | Chen | H02P 29/64 |
| | | | 702/58 |
| 2011/0299335 A1* | 12/2011 | Lee | G11C 16/0483 |
| | | | 365/185.03 |
| 2014/0059406 A1* | 2/2014 | Hyun | G11C 11/5628 |
| | | | 714/773 |
| 2014/0226412 A1* | 8/2014 | Yeh | G11C 16/3418 |
| | | | 365/185.21 |
| 2014/0254285 A1* | 9/2014 | Eguchi | G11C 16/14 |
| | | | 365/185.29 |
| 2014/0281154 A1 | 9/2014 | Hashimoto et al. | |
| 2015/0340099 A1* | 11/2015 | Kwak | G11C 29/028 |
| | | | 711/103 |
| 2016/0054380 A1* | 2/2016 | Walker | G11C 29/028 |
| | | | 324/750.03 |
| 2016/0239235 A1* | 8/2016 | Chung | G11C 7/04 |
| 2017/0213959 A1* | 7/2017 | Gibson | C22C 5/04 |
| 2017/0330631 A1* | 11/2017 | Diep | G11C 7/04 |
| 2018/0347493 A1 | 12/2018 | Tascillo et al. | |
| 2018/0374548 A1* | 12/2018 | Achtenberg | G06F 11/1072 |
| 2019/0311770 A1* | 10/2019 | Gupta | G11C 11/5635 |
| 2020/0004671 A1* | 1/2020 | Neufeld | G11C 16/10 |
| 2020/0273529 A1* | 8/2020 | Liu | G06F 11/1072 |

* cited by examiner

PROGRAM PULSE CONTROL USING ENVIRONMENTAL PARAMETERS

RELATED APPLICATION

This application is a continuation of and claims priority to U.S. patent application Ser. No. 16/669,244, filed Oct. 30, 2019, the entire content of which is hereby incorporated by reference.

TECHNICAL FIELD

Embodiments of the disclosure relate generally to memory sub-systems, and more specifically, relate to program pulse control using environmental parameters.

BACKGROUND

A memory sub-system can be a storage device, a memory module, and a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to controlling and adjusting program pulse characteristics in view of usage parameters and environmental parameters. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

To program data to a memory sub-system, a memory controller can apply a voltage across the gates of a NAND device to trap charges (e.g., electrons) in the floating gate of the NAND. The memory controller can apply the voltage in a pulse, known as a program pulse. The amount of voltage and the width of the pulse can determine the amount of charge that will be stored at the NAND device, and in turn programs the state of the NAND. In some instances, the memory controller can apply a program pulse, verify the state of the NAND, and then apply another program pulse if required. This pulse-verify-pulse sequence can ensure that the NAND is correctly programmed without applying a larger voltage that can cause more damage to the NAND.

As a memory sub-system ages, the voltage (Vt) distributions of the NAND states of the memory cells tend to widen and therefore a higher program pulse can be required toward the end of the life of a memory sub-system to ensure data can properly be read. Therefore, the memory controller in conventional memory systems uses a program pulse that accounts for end of life conditions (i.e., begins with a larger program pulse voltage and/or width). However, using a larger program pulse at the beginning of the life of the memory sub-system can reduce the life span of the memory component because the larger program pulses can cause more damage to the NAND components unnecessarily, than if lower program pulses were used instead.

Additionally, some memory sub-systems used in embedded systems that tend to experience extreme temperatures, large shifts in temperature, or other environmental factors that cause data degradation can require larger program pulses to ensure data is not lost in worst case scenarios. Conventionally, the larger program pulses are used throughout the life of the memory sub-system. However, the memory sub-system might not always be used in the worst case scenarios and thus a larger program pulse is used even though it may be unnecessary. Thus, the life of the memory sub-system can be significantly reduced due to the unnecessary use of the larger program pulse.

Aspects of the present disclosure address the above and other deficiencies by providing the ability to use environmental parameters to control program pulse characteristics. The memory sub-system can receive, from a user, configuration parameters that identify the intended usage of the memory device(s) in the memory sub-system. Based on the intended usage, a memory controller in the memory sub-system can determine an initial program pulse as well as a weight associated with environmental parameters/statistics identified early in the memory device's lifespan. The memory controller can monitor environmental parameters from sensors that identify the conditions of the environment surrounding the memory sub-system (e.g., temperature). Thus, the memory controller can monitor the actual conditions in which the memory sub-system is disposed in real time and determine an appropriate program pulse to reduce the amount of wear on the device but that still ensures that data is not lost due to changing conditions.

Therefore, the ability to control program pulse characteristics based on usage and environment could substantially increase the lifetime of memory sub-systems. The advantages are particularly useful in embedded memory systems where replacement of the memory sub-system can be difficult, or impossible.

Figure 1:
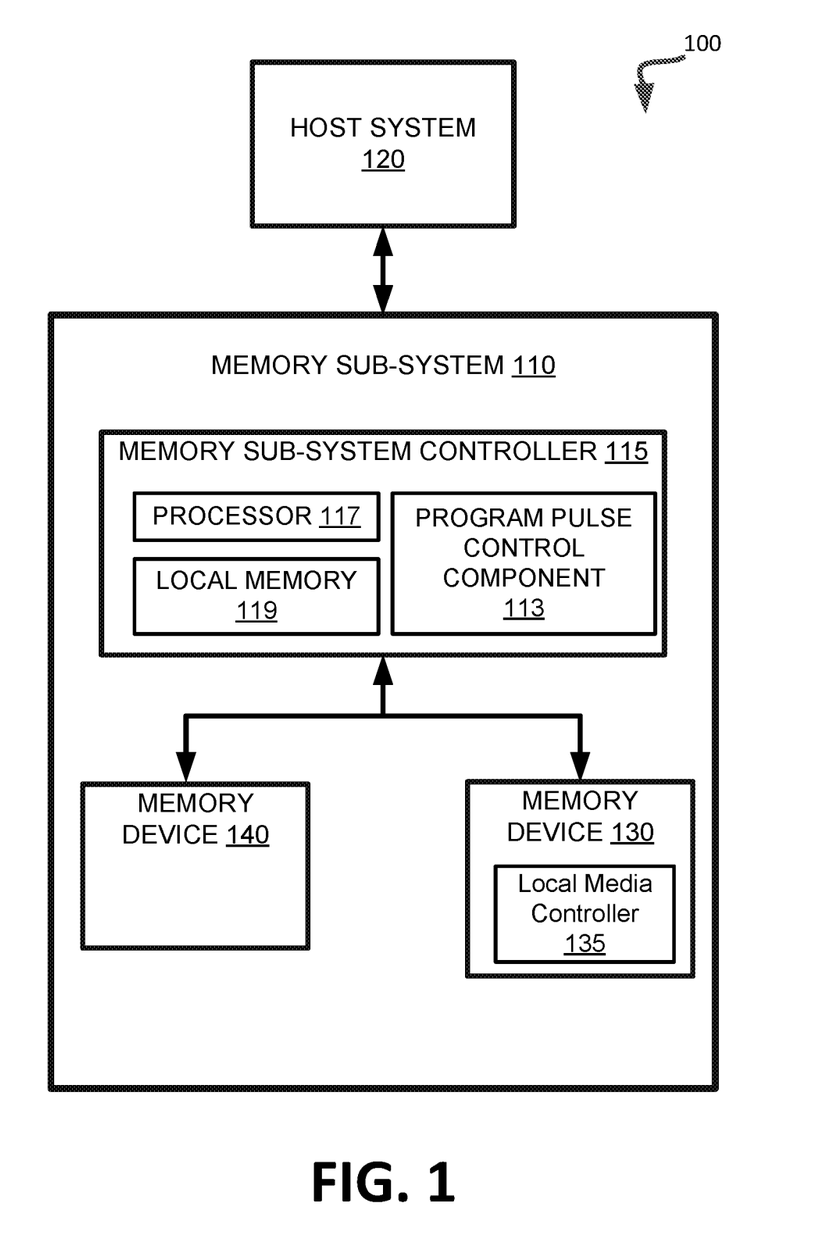
FIG. 1 illustrates an example computing environment that includes a memory sub-system, in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a program pulse control component 113 that can be used to control program pulse characteristics based on environmental parameters. In some embodiments, the memory sub-system controller 115 includes at least a portion of the program pulse control component 113. For example, the memory sub-system controller 115 can include a processor 117 (processing device) configured to execute instructions stored in local memory 119 for performing the operations described herein. In some embodiments, the program pulse control component 113 is part of the host system 110, an application, or an operating system.

The program pulse control component 113 can select program pulse characteristics based on environmental parameters. The program pulse control component 113 can monitor the environment of the memory sub-system 110 and the memory devices 130 to determine the program pulse characteristics to select. The program pulse control component 113 can receive configuration parameters from host system 120. The program pulse control component 113 can use these configuration parameters to establish a baseline for the program pulse characteristics and to apply a weight to environmental factors. The program pulse control component 113 can use the weight to further determine which program pulse characteristics to select. Further details with regards to the operations of the program pulse control component 113 are described below.

Figure 2:
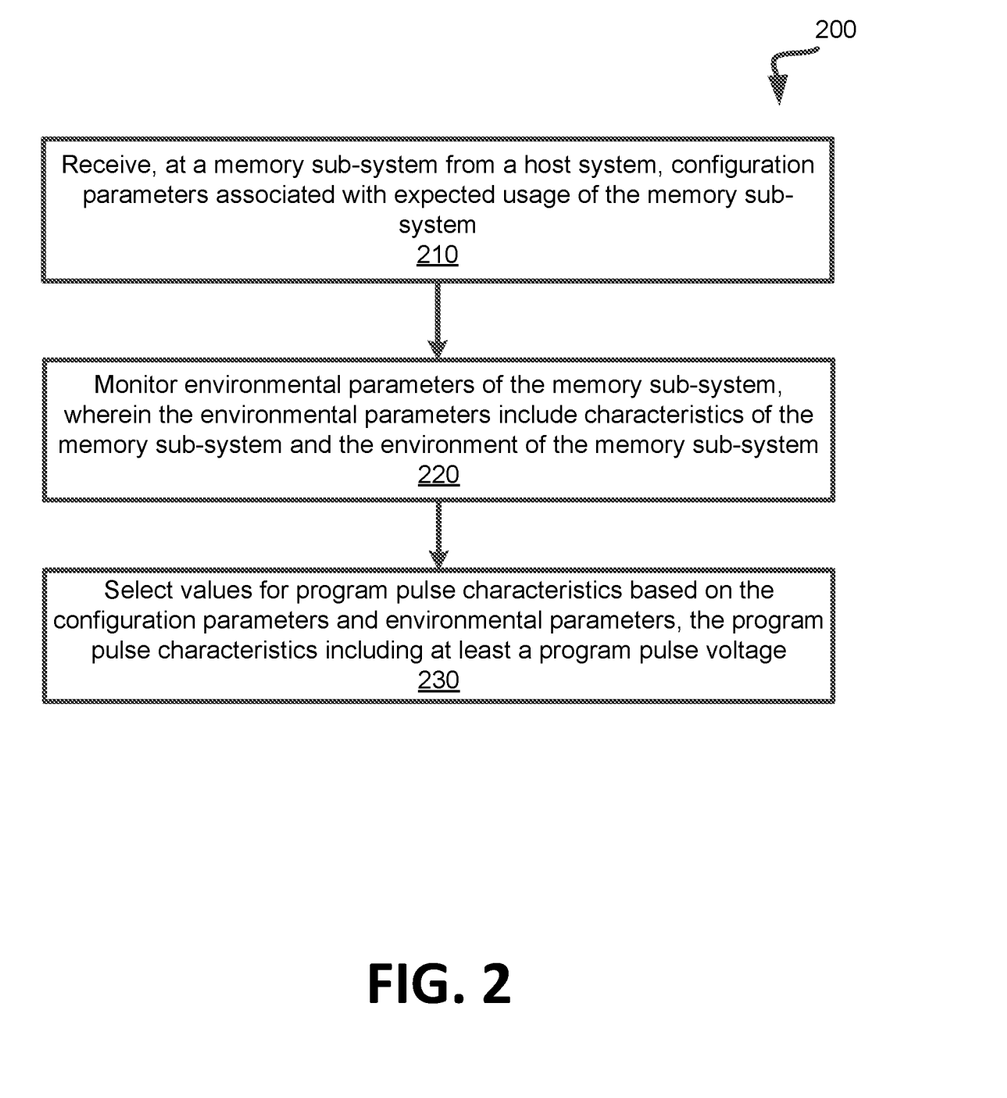
FIG. 2 is a flow diagram of an example method to control program pulse characteristics in view of environmental parameters, in accordance with some embodiments of the present disclosure.

FIG. 2 is a flow diagram of an example method 200 to control program pulse characteristics based on environmental parameters, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the program pulse control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic of a memory sub-system receives, from a host system, configuration parameters associated with expected usage of the memory sub-system. The configuration parameters can be provided by the host system automatically or by a user of the host system. The parameters can include the expected environment and location that the memory sub-system is to be exposed to and used in. Additionally, the configuration parameters can include an expected type of use of the memory sub-system. For example, the host can indicate that the memory sub-system is located in an automobile, a cellular device, a laptop, or any in any other embedded system. Thus, using the configuration parameters, the processing logic can determine the expected environment and usage characteristics for the memory sub-system. From the expected environment and usage, the processing logic can determine initial values for the program pulse used to write data to a memory device of the memory sub-system.

At operation 220, the processing logic monitors environmental parameters including characteristics of the memory sub-system and the environment surrounding the memory sub-system. The environmental parameters can be fluctuations of temperature, usage statistics, age of the device, and any other internal or external parameter that can impact data stability in memory devices of the memory sub-system (i.e., how long after the data is programmed the data remains the valid). For example, large temperature fluctuations between a program operation and a read operation can increase a bit error rate when reading the data. The Vt distributions of the memory cells of a memory device can shift due to the temperature fluctuations resulting in the larger error rate. Additionally, the processing logic can monitor usage statistics of the memory sub-system and store the usage statistics at the memory sub-system. For example, a larger number of program and erase (P/E) cycles can mean a larger bit error rate when reading the data because the Vt distributions tend to widen and overlap as the number of PIE cycles increases. Also, if usage indicates that the memory sub-system is turned off for a long period of time then it is likely that the bit error rate can increase due to charge lost from the memory cells during power off. Extreme temperatures can also indicate that there will be more bit errors. In addition to the usage statistics, the processing logic can monitor the actual bit error rate and refresh rate of memory devices of the memory sub-system.

At operation 230, the processing logic selects values for program pulse characteristics of the memory sub-system based on the configuration parameters and the environmental parameters, wherein the program pulse characteristics include at least a program pulse voltage. Each of the characteristics of the program pulse can be adjusted. The characteristics of the program pulse can include a voltage, a width of the pulse (i.e., how long the pulse is applied), and the current of the pulse. Applying a larger voltage can program a memory cell faster but can cause more wear. A lower voltage and a wider (longer) pulse can cause less wear but can increase the program latency time. Accordingly, which characteristic to adjust and by how much can depend on the user's needs.

As described above with respect to operation 220, environmental factors can cause higher bit error rates and/or refresh rates. Therefore, the monitoring of the bit error rate and refresh rate can be used to adjust the program pulse voltage and thus the Vt distributions accordingly. If an environmental factor that generally causes higher bit error rate is detected (e.g., large temperature fluctuations) then the processing logic can increase the program pulse voltage. In addition, if the bit error rate increases, or the rate of refresh increases then the processing logic can increase the program voltage to adjust the Vt distributions and reduce the bit error rate. A high refresh rate can indicate that the bit error rate is increasing faster than it should, such as due to the environmental parameters.

Figure 3:
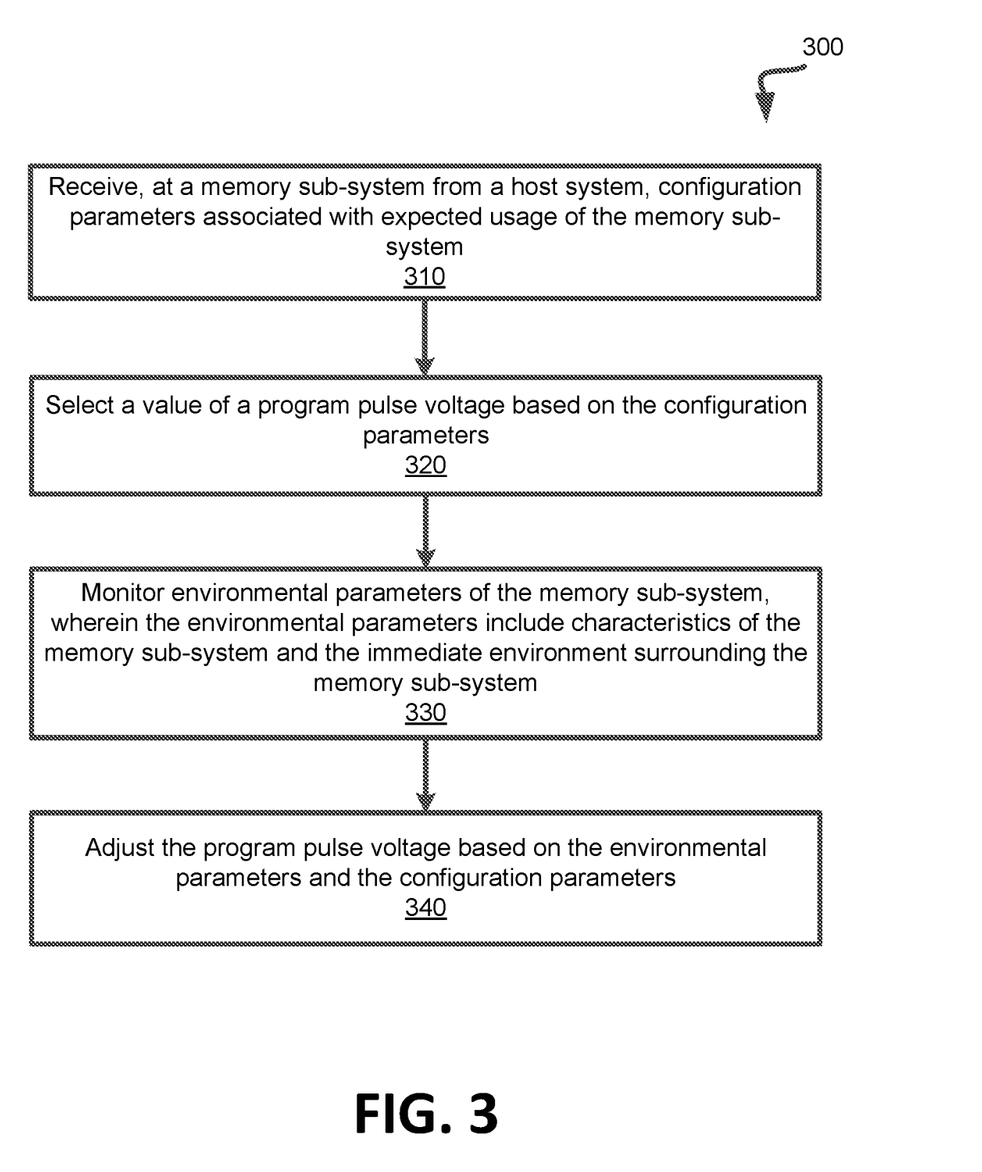
FIG. 3 is a flow diagram of an example method to adjust program pulse characteristics in view of use and environmental factors, in accordance with some embodiments of the present disclosure.

FIG. 3 is a flow diagram of an example method 300 to control program pulse characteristics based on environmental parameters, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the program pulse control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, processing logic of a memory component receives, from a host system, configuration parameters associated with expected usage of the memory sub-system. The expected usage of the memory sub-system can include the geographic location the memory sub-system is to be used, a type of use, an environment in which the memory sub-system is to be disposed, etc. For example, the expected usage can indicate whether the memory sub-system will be used indoors or outdoors, whether it will be stationary or mobile, and so forth. The expected usage can indicate expected worst case conditions for the memory sub-system.

At operation 320, the processing logic selects a value of a program pulse voltage based on the configuration parameters. Expected usage identified from the configuration parameters can be used to determine what the worst case conditions for the memory sub-system are expected to be. For example, the configuration parameters can indicate what the average temperature will be, what the temperature fluctuations in the environment will be, etc. Based on the configuration parameters and the expected usage of the memory sub-system, the processing logic can select a value for the program pulse voltage so that stored data can be stable enough to meet performance specifications of the memory sub-system in those conditions (e.g., the data can be maintained for 6 months in the identified conditions).

At operation 330, the processing logic monitors environmental parameters of the memory sub-system, wherein the environmental parameters include characteristics of the memory sub-system and the immediate environment surrounding the memory sub-system. The environmental parameters can be fluctuations of temperature, usage statistics, age of the device, and any other internal or external parameter that can impact data stability/validity. For example, large temperature fluctuations between a program operation and a read operation can increase a bit error rate when reading the data. The Vt distributions of the memory cells of a memory component of the memory sub-system can shift due to the temperature fluctuations resulting in the larger error rate. Additionally, the processing logic can monitor usage statistics of the memory sub-system which can also be stored by the memory sub-system. For example, a larger number of P/E cycles can result in a larger bit error rate when reading the data due to widening Vt distributions as wear on the device occurs from P/E cycles. In addition, if usage indicates that the device is turned off for long period of time then it can be likely that the bit error rate will increase due to charge lost from the memory cells during power off. Extreme temperatures can also indicate that there will be more bit errors. The processing logic can also monitor a bit error rate and refresh rate of the memory sub-system.

At operation 340, the processing logic adjusts the program pulse voltage of the memory component based on the environmental parameters and the configuration parameters. The processing logic can adjust each of the characteristics of the program pulse. The characteristics of the program pulse can include a voltage, a length of pulse (i.e., how long the pulse is applied), and the current of the pulse. Applying a larger voltage can program a memory cell faster but can cause more wear while a lower voltage can cause less wear but can increase the time required to program a memory cell. Accordingly, which adjustment of the program pulse can depend on the user's needs.

Furthermore, as the memory sub-system ages, the statistics associated with the environmental parameters that have been previously collected can be reduced in weight according to the configuration parameters that were received from the host system. When the environment that the memory sub-system is used in is very steady, environmental statistics are more likely to vary less. When the environment is highly volatile then the early statistics are likely to differ substantially from more current environmental statistics. Therefore, processing logic can change the weight that the processing logic puts on previous (early life) environmental parameters based on the expected environment and usage identified by the configuration parameters. For example, if the configuration parameters indicate that a condition is satisfied (i.e., that the environment/use changes more than a threshold amount within a specified time period) then previously collected statistics can be reduced in weight when determining a program pulse voltage to select. On the other hand, if the condition is not satisfied (i.e., that the environment/use does not change more than the threshold mount in the specified time period) then the weight put on earlier collected environmental statistics can remain steady or can be reduced less than if the condition is satisfied.

As described above with respect to operation 330, environmental factors can cause higher bit error rates and thus the monitoring of those factors can be used by the processing logic to adjust the program pulse voltage and thus the Vt distributions accordingly. If an environmental factor that generally causes higher bit error rate is detected (e.g., large temperature fluctuations) then the program pulse voltage can be increased. In addition, if the bit error rate increases, or the rate of refresh increases then the program voltage can be increased to adjust the Vt distributions and reduce the bit error rate. A high refresh rate can indicate that the bit error rate is increasing faster than it should, such as due to the environmental parameters.

Figure 4:
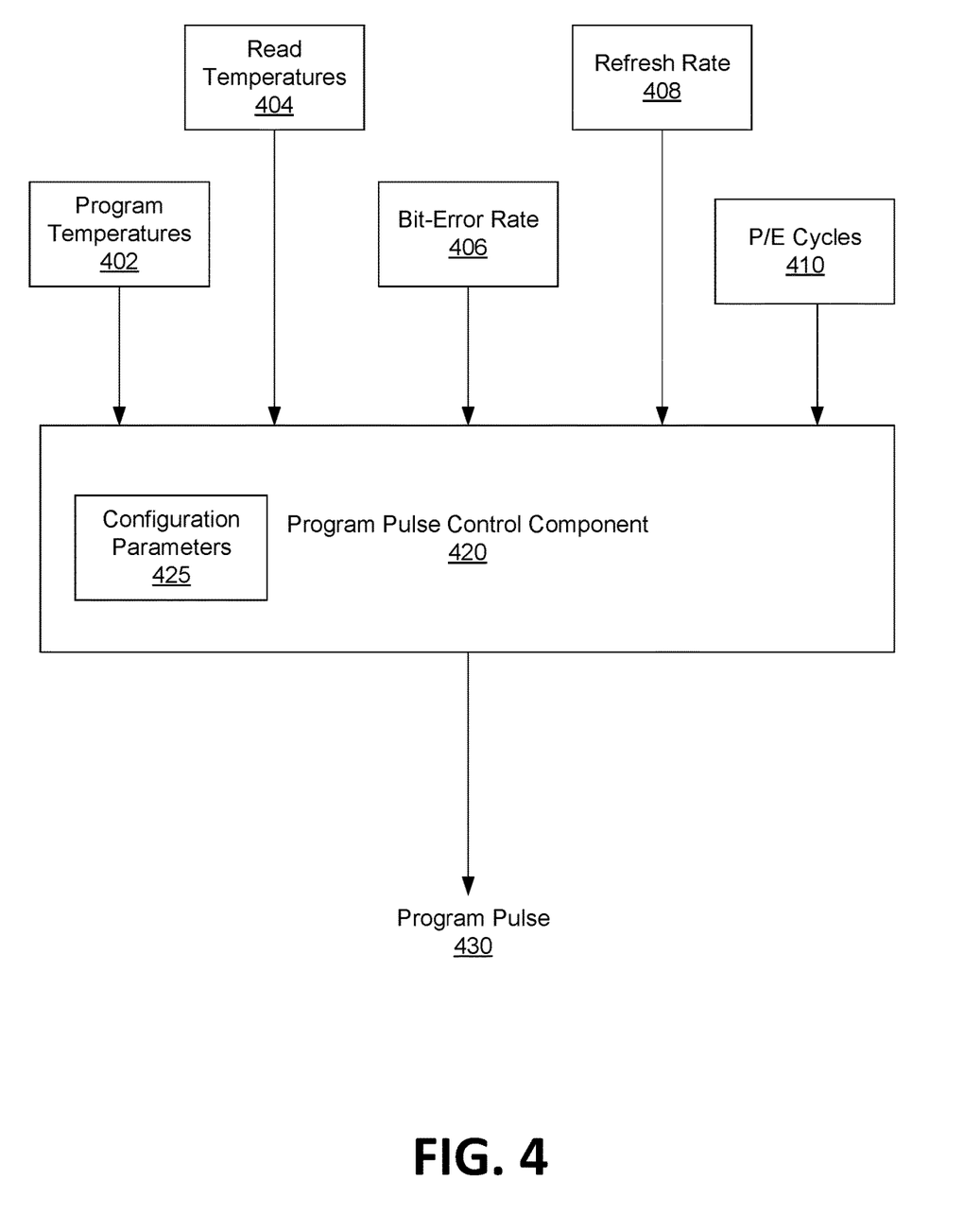
FIG. 4 illustrates an example program pulse control component in accordance with some embodiments of the present disclosure.

FIG. 4 depicts a program pulse control component 113 in accordance with some embodiments of the present disclosure. The program pulse control component 113 can initially receive configuration parameters 425 from a host system. The program pulse control component 113 can use the configuration parameters 425 to identify an initial program pulse 430 to use for program operations. The configuration parameters 425 can identify the environments and expected usage of the memory component is expected to be used in. Therefore, program pulse control component 113 can select the program pulse 430 to ensure that the data stored in the memory component remains valid for a minimum period of time in view of the expected environment and usage. If the configuration parameters indicate that the environment and use is to be relatively stable then the program pulse control component 113 can select a relatively low program pulse 430 voltage or width to reduce wear on the memory component due to program operations. The program pulse control component 113 can also receive, from sensors or other components, one or more environmental parameters and/or usage statistics of the memory component.

In one example, the program pulse control component 113 can receive program temperatures 402, read temperatures 404, a bit-error rate 406, a refresh rate 408, and a number of P/E cycles 410. The program temperatures 402 can be temperatures that are recorded when data is written to the memory component. The program temperatures 402 can be stored as associated with the data, or the portion of memory where the data is stored. Similarly, read temperatures 404 can be the temperature of the memory component when data that was previously written is read from the memory component. Thus, using the program temperatures 402 and the read temperatures 404, not only can the average temperature of the memory component be determined but also a range of temperatures over which data is read or written. Because large variations in temperature can cause data degradation (e.g., data written at low temperature but read at high temperature) and increase bit-error rates, the program pulse 430 can be adjusted to a higher voltage or a larger width (i.e. longer pulse). The larger program pulse 430 can help to ensure that the data can remain valid and accessible despite larger variations in temperature than originally expected from the configuration parameters 425.

The bit-error rate 406 and refresh rate 408 can also be used to adjust the program pulse 430. For example, if a bit-error rate 406 becomes larger over a period of time then the program pulse control component 113 can increase the voltage or width of the program pulse 430 to increase the difference between Vt states and reduce the bit-error rate 406. A high refresh rate 408 can indicate that the bit-error rate 406 is consistently increasing and that the data is relatively unstable under current conditions. Thus, if the refresh rate 408 is high then the program pulse control component 113 can increase the voltage or width of the program pulse. With respect to program/erase (P/E) cycles 410 the more P/E cycles 410 that there are, generally the more distributed the Vt states become and thus can cause increased read errors. Therefore, as the P/E cycles 410 increase the program pulse control component 113 can increase the voltage or width of the program pulse 430. In addition, the program pulse control component 113 can reduce the voltage and/or width of the program pulse 430 if any of the environmental parameters indicate that the environment is more stable than expected (e.g., low temperature variability, low bit-error rates, low refresh rates, etc.). It should also be noted that any number of environmental parameters and/or usage statistics can be used by the program pulse control component 113 to adjust the program pulse 430.

Figure 5:
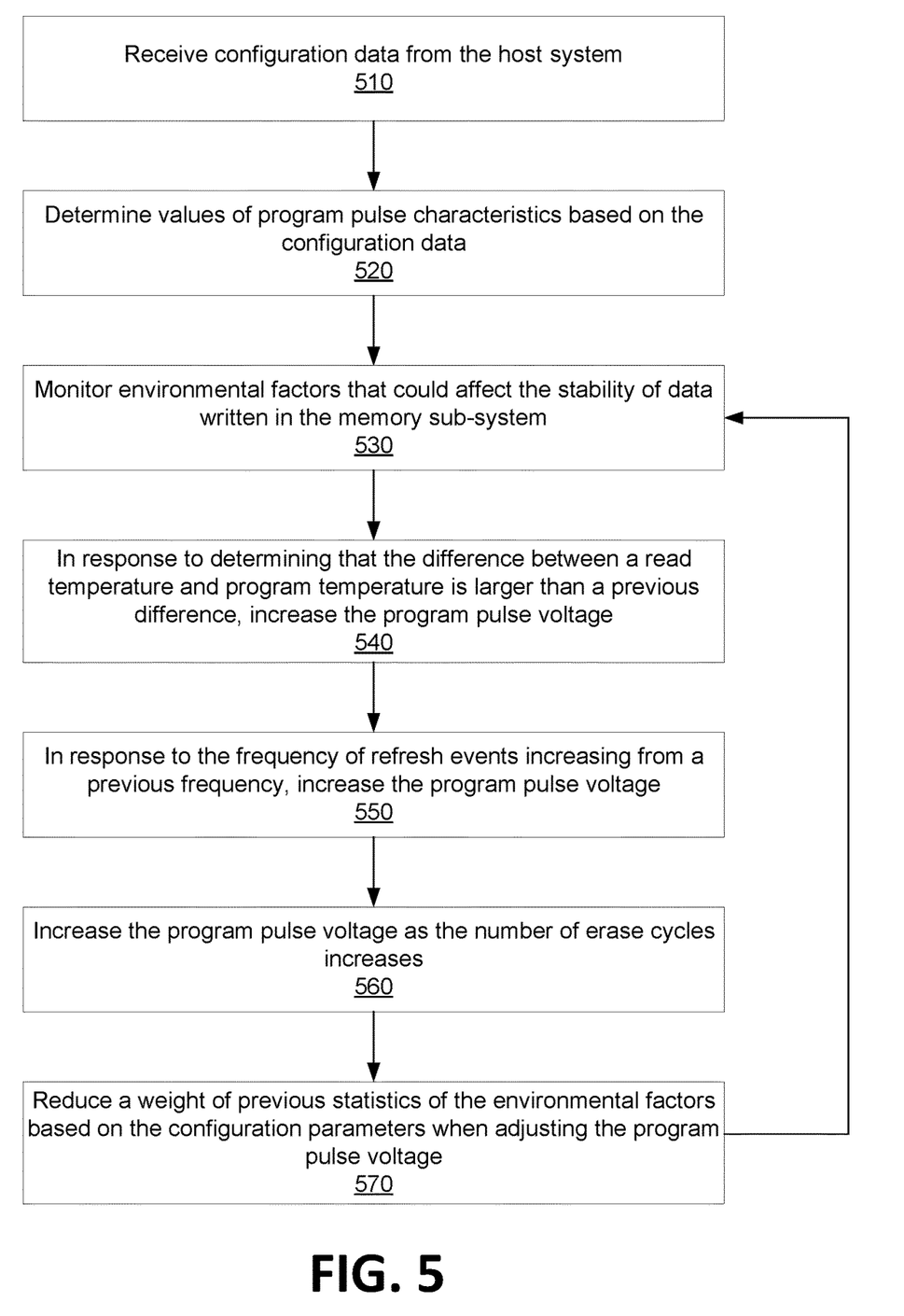
FIG. 5 is a flow diagram of an example method to control program pulse characteristics based on environmental parameters in accordance with some embodiments of the present disclosure.

FIG. 5 is a flow diagram of an example method 500 to control program pulse characteristics based on environmental parameters, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the program pulse control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives configuration data from the host system. The configuration data can indicate the environment in which the memory sub-system is expected to be used. At operation 520, the processing logic determines values of program pulse characteristics based on the configuration data received from the host system. The program pulse characteristics can include a voltage, current and a width of the program pulse. The processing logic can select values of the program pulse characteristics based on the configuration data received from the host system. In one example, the configuration data indicates the expected environment of the memory sub-system. The processing logic can select a program pulse voltage to be higher if the environment is expected to be volatile or extreme and lower if the environment is stable and moderate. Therefore, a baseline program pulse can be selected based on the configuration data.

At operation 530, the processing logic monitors environmental factors that could affect the validity and stability of the data written in the memory sub-system. The environmental factors can include temperatures associated with programs and reads of data in the sub-system, bit-error rates, frequency of refresh events, and number of P/E cycles. The processing logic can also monitor any other environmental factors, usage statistics, or other parameters. The processing logic can monitor environmental factors using internal or external sensors of the host system and/or memory sub-system. The factors can be continuously monitored throughout the below operations 540, 550, and 560.

At operation 540, if environment factors indicate that the environment is less stable than expected, the processing logic increases the program pulse voltage. If the environmental factors indicate that the environment is more stable than expected, the processing logic can reduce the program pulse voltage, current or width. At operation 550, if the frequency of refresh events increases from a previously recorded frequency of refresh events, the processing logic increases the program pulse voltage. Alternatively, if the frequency of refresh events decreases or is very low, the processing logic can decrease the program pulse voltage. At operation 560, the processing logic increases the program pulse voltage as the number of P/E cycles increases.

At operation 570, the processing logic reduces a weight of previous statistics for the environmental factors based on the configuration parameters when adjusting the program pulse voltage. When the configuration parameters indicate that the environment or use of the memory sub-system will be very steady, environmental statistics are more likely to vary less. Similarly, if the configuration parameters indicate that the environment or use of the memory sub-system is highly volatile then the early statistics are likely to differ substantially from more current environmental statistics. Therefore, the weight that the processing logic puts on previous (early life) environmental parameters can be changed based on the expected environment and usage identified by the configuration parameters. For example, if the configuration parameters indicate that a condition is satisfied (i.e., that the environment/use is volatile) then the processing logic can reduce a weight of previously collected statistics at a higher rate when determining a program pulse voltage to select than if the condition is not satisfied. On the other hand, if the condition is not satisfied (i.e., the environment is steady) then the processing logic can keep the weight put on earlier collected environmental statistics steady or reduce the weight at a slower rate than if the condition is satisfied.

After operation 560 is complete, the processing logic returns to operation 530 to continue to monitor environmental factors. Although depicted as executing operations 540, 550, 560, and 570 before returning to operation 530, it should be noted that the processing logic can return to operation 530 after execution of any of the operations. Operation 530 can also continue to execute throughout execution of operations 540, 550, 560, and 570. In addition, the processing logic can use any other number of operations and parameters to adjust the program pulse. The description above refers to adjusting the program pulse voltage of the memory sub-system, however it should be noted that any program pulse characteristic can be adjusted similarly.

Figure 6:
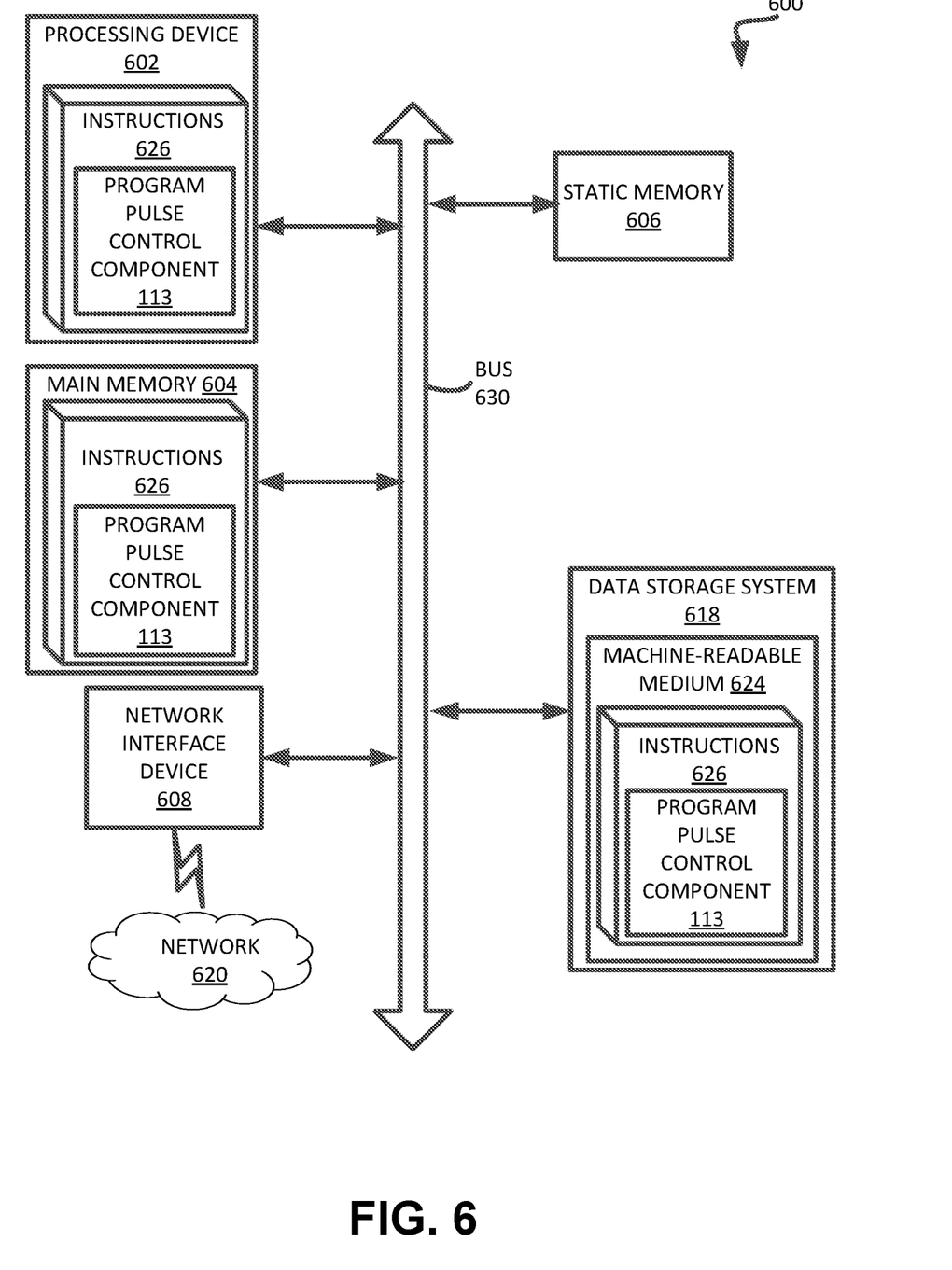
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program pulse control component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a program pulse control component (e.g., the program pulse control component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving, at a memory sub-system from a host system, one or more configuration parameters reflecting an expected type of use of the memory sub-system;
   receiving one or more environmental parameters of the memory sub-system, wherein the environmental parameters reflect characteristics of an environment of the memory sub-system, wherein the environmental parameters are associated with one or more weight factors;
   selecting a programming operation parameter to be utilized by the memory sub-system, to program data, based on the configuration parameters, environmental parameters, and the one or more weight factors; and
   reducing, based on the selected programming operation parameter, the one or more weight factors of the one or more environmental parameters.

2. The method of claim 1, wherein the configuration parameters comprise at least one of:
   an expected environment in which the memory sub-system is used;
   an expected location in which the memory sub-system is used; or
   an expected type of use of the memory sub-system.

3. The method of claim 1, further comprising:
   selecting values for program pulse characteristics of the memory sub-system based on the configuration parameters and environmental parameters, the program pulse characteristics comprising at least a program pulse voltage, wherein the program pulse characteristics further comprise at least one of a width of the program pulse or a current of the program pulse.

4. The method of claim 1, wherein the environmental parameters comprise at least one of:
   a program temperature, wherein the program temperature indicates a temperature at which a portion of the memory sub-system was programmed;
   a read temperature, wherein the read temperature indicates a temperature at which data is read from the memory sub-system;
   a bit-error rate of the memory sub-system, wherein the bit-error rate indicates a number of bits that have been identified as incorrect during an interval of time; or
   a frequency of data refresh events, wherein the frequency of data refresh events indicates how often the memory sub-system has been refreshed.

5. The method of claim 1,
   wherein if the configuration parameters indicate that a first condition is satisfied then the weighting of a previous statistics is reduced at a faster rate than if the configuration parameters indicate that the first condition is not satisfied.

6. The method of claim 5, wherein the first condition is satisfied when the configuration parameters indicate that an expected environment of the memory sub-system changes more than a threshold amount within a defined period of time.

7. A system comprising:
   a memory device; and
   a processing device, operatively coupled with the memory device, to perform operations comprising:
   receiving one or more configuration parameters reflecting an expected type of use of the memory device;
   receiving one or more environmental parameters of the memory device, wherein the environmental parameters reflect characteristics of an environment of the memory device, wherein the environmental parameters are associated with one or more weight factors;
   selecting a programming operation parameter to be utilized by the memory device, to program data, based on the configuration parameters, environmental parameters, and the one or more weight factors; and
   reducing, based on the selected programming operation parameter, the one or more weight factors of the one or more environmental parameters.

8. The system of claim 7, wherein the environmental parameters comprise at least one of:
   data associated with temperatures of the environment in which the memory device is used; or
   data associated with usage of the memory device.

9. The system of claim 7, wherein the configuration parameters indicate an expected temperature variability of an expected usage environment, and wherein a temperature variability above a threshold value indicates that previous statistics of environmental factors are to be weighted less as the memory device ages.

10. The system of claim 7, wherein the processing device is to perform operations further comprising:
    adjusting a program pulse voltage of the memory device based on the environmental parameters and the configuration parameters, wherein to adjust the program pulse voltage the processing device is to:
    determine that a bit-error rate of the memory device using the program pulse voltage exceeds a threshold bit-error rate; and adjust the program pulse voltage to reduce the bit-error rate of the memory device.

11. The system of claim 10, wherein to select a value of the program pulse voltage, the processing device is to perform operations further comprising:
selecting the value of the program pulse voltage to provide data in the memory device that is stable for a specified period of time in view of an expected usage environment.

12. The system of claim 11, wherein the processing device is to perform operations further comprising:
in response to the environmental parameters indicating that stability of the data during the specified period of time will be reduced, increasing the program pulse voltage.

13. The system of claim 7, wherein the processing device is to perform operations further comprising:
adjusting a program pulse width in view of the configuration parameters and environmental parameters.

14. A non-transitory computer-readable storage medium comprising instructions that, when executed by a processing device, to perform operations comprising:
receiving one or more configuration parameters reflecting an expected type of use of a memory device;
receiving one or more environmental parameters of the memory device, wherein the environmental parameters reflect characteristics of an environment of the memory device, wherein the environmental parameters are associated with one or more weight factors;
selecting a programming operation parameter to be utilized by the memory device, to program data, based on the configuration parameters, environmental parameters, and the one or more weight factors; and
reducing, based on the selected programming operation parameter, the one or more weight factors of the one or more environmental parameters.

15. The non-transitory computer-readable storage medium of claim 14, wherein the configuration parameters comprise at least one of:
an expected environment in which the memory device is used;
an expected location in which the memory device is used; or
the expected type of use of the memory device, wherein the expected type of use comprises an application for which the memory device is used.

16. The non-transitory computer-readable storage medium of claim 14, wherein the processing device is to perform operations further comprising:
selecting values for program pulse characteristics of the memory device based on the configuration parameters and environmental parameters, the program pulse characteristics comprising at least a program pulse voltage, wherein the program pulse characteristics further comprise at least one of a width of the program pulse or a current of the program pulse.

17. The non-transitory computer-readable storage medium of claim 14, wherein the environmental parameters comprise at least one of:
a program temperature, wherein the program temperature indicates a temperature at which a portion of the memory device was programmed;
a read temperature, wherein the read temperature indicates a temperature at which data is read from the memory device;
a bit-error rate or the memory device, wherein the bit-error rate indicates a number of bits that have been identified as incorrect during an interval of time; or
a frequency of data refresh events, wherein the frequency of data refresh events indicates how often the memory device has been refreshed.

18. The non-transitory computer-readable storage medium of claim 14, wherein if the configuration parameters indicate that a first condition is satisfied then the weighting of a previous statistics is reduced at a faster rate than if the configuration parameters indicate that the first condition is not satisfied.

* * * * *